US012775759B2

(12) United States Patent
Wright et al.

(10) Patent No.: US 12,775,759 B2
(45) Date of Patent: Oct. 27, 2026

(54) SYSTEMS AND METHODS FOR CONFIGURING FIRE EXTINGUISHERS WITHIN A COMPARTMENT

(71) Applicant: THE BOEING COMPANY, Chicago, IL (US)

(72) Inventors: Robert S. Wright, Seattle, WA (US); Daniel Wright Baisley, Lynnwood, WA (US); Scott Adrian O'Brien, Seattle, WA (US)

(73) Assignee: The Boeing Company, Arlington, VA (US)

( * ) Notice: Subject to any disclaimer, the term of this patent is extended or adjusted under 35 U.S.C. 154(b) by 1161 days.

(21) Appl. No.: 17/808,585

(22) Filed: Jun. 24, 2022

(65) Prior Publication Data

US 2023/0414981 A1 Dec. 28, 2023

(51) Int. Cl.

| | |
|---|---|
| ***G06F 30/28*** | (2020.01) |
| ***A62C 3/08*** | (2006.01) |
| ***A62C 31/03*** | (2006.01) |
| ***F02C 7/25*** | (2006.01) |

(52) U.S. Cl.

CPC .............. *G06F 30/28* (2020.01); *A62C 31/03* (2013.01); *A62C 3/08* (2013.01); *F02C 7/25* (2013.01)

(58) Field of Classification Search

CPC ........... G06F 30/28; A62C 31/03; A62C 3/08; A62C 3/06; A62C 99/009; A62C 31/02; A62C 31/28; A62C 37/00; F02C 7/25

See application file for complete search history.

(56) References Cited

U.S. PATENT DOCUMENTS

| | | | | |
|---|---|---|---|---|
| 7,195,180 | B2 * | 3/2007 | Lee ........................ | B64D 41/00 169/44 |
| 7,647,216 | B2 | 1/2010 | Bermejo | |
| 8,756,040 | B2 | 6/2014 | Cruz | |
| 9,168,407 | B2 | 10/2015 | Kho | |
| 10,180,996 | B2 | 1/2019 | Georgescu | |
| 11,257,354 | B2 | 2/2022 | Daly | |

(Continued)

FOREIGN PATENT DOCUMENTS

| | | | |
|---|---|---|---|
| CN | 102068776 A | * | 5/2011 |
| CN | 110990942 A | * | 4/2020 |
| EP | 0661081 | | 7/1995 |

OTHER PUBLICATIONS

Lopez, Amalia R., Louis A. Gritzo, and Basil Hassan. Computational fluid dynamics simulation of the air/suppressant flow in an uncluttered F18 engine nacelle. No. SAND-97-0352C; CONF-9705117-1. Sandia National Lab.(SNL-NM), Albuquerque, NM (United States), 1997. (Year: 1997).*

(Continued)

*Primary Examiner* — Bijan Mapar

(74) *Attorney, Agent, or Firm* — Joseph M. Butscher; Carroll, Hoette & Butscher, LLC

(57) ABSTRACT

A system and a method for configuring one or more fire extinguishers within a compartment include a configuration control unit configured to determine one or more fluid flow paths within the compartment from a fluid dynamics model. The configuration control unit is further configured to determine a configuration for one or more nozzles of the one or more fire extinguishers based on the one or more fluid paths.

20 Claims, 6 Drawing Sheets

(56) References Cited

U.S. PATENT DOCUMENTS

| | | | | |
|---|---|---|---|---|
| 2006/0273223 | A1 * | 12/2006 | Haaland ............ | A62C 99/0018 169/62 |
| 2019/0224514 | A1 | 7/2019 | Cao | |
| 2020/0293706 | A1 | 9/2020 | Vergil | |
| 2021/0026927 | A1 | 1/2021 | Daly | |
| 2021/0027612 | A1 | 1/2021 | Daly | |
| 2021/0240875 | A1 | 8/2021 | Fernandez | |
| 2021/0248282 | A1 | 8/2021 | Fernandez | |
| 2021/0255191 | A1 | 8/2021 | Shigeta | |
| 2021/0394001 | A1 | 12/2021 | Haaland | |
| 2022/0161279 | A1 | 5/2022 | Baldwin | |

OTHER PUBLICATIONS

Xiong, Dapeng, Mingbo Sun, Jiangfei Yu, Zhiwei Hu, Yixin Yang, Hongbo Wang, and Zhengguo Wang. "Effects of confinement and curvature on a jet in a supersonic cross-flow." Proceedings of the Institution of Mechanical Engineers, Part G: Journal of Aerospace Engineering 236, No. 16 (2022): 3518-3530. (Year: 2022).*

Lee, Jaesoo. "Simulation method for the fire suppression process inside the engine core and APU compartments." In Proceedings of the Fourth Triennial International Aircraft Fire and Cabin Safety Research Conference, Lisabon, Portugal, pp. 15-18. 2004. (Year: 2004).*

Park, Hongbok, Sam S. Yoon, and Stephen D. Heister. "A nonlinear atomization model for computation of drop size distributions and spray simulations." International journal for numerical methods in fluids 48, No. 11 (2005): 1219-1240. (Year: 2005).*

Ghosh, S., and J. C. R. Hunt. "Spray jets in a cross-flow." Journal of Fluid Mechanics 365 (1998): 109-136. (Year: 1998).*

Arif, I., Masud, J., & Shah, S. (2018). Computational analysis of integrated engine exhaust nozzle on a supersonic fighter aircraft. Journal of Applied Fluid Mechanics, 11(6), 1511-1520. (Year: 2018).* https://ieeexplore.ieee.org/document/8408018.

https://doi.org/10.3390/aerospace8020035.

Extended European Search Report for EP App. No. 23166100.0-1015, dated Nov. 27, 2023.

* cited by examiner

SYSTEMS AND METHODS FOR CONFIGURING FIRE EXTINGUISHERS WITHIN A COMPARTMENT

FIELD OF THE DISCLOSURE

Examples of the present disclosure generally relate to systems and methods for configuring fire extinguishers within a compartment, such as an engine of an aircraft.

BACKGROUND OF THE DISCLOSURE

Various systems include compartments that require fire extinguishers. For example, certain aircraft include engines that include fire extinguishers configured to extinguish potential internal or external fires.

Development of fire extinguishing distribution systems for portions of an aircraft is typically an iterative, time-consuming, and expensive process. In particular, bottles of fire extinguishing agent are typically discharged into a compartment (such as a full scale engine or auxiliary power unit), and concentrations of the fire extinguishing agent are measured at various points within the compartment. If distribution of the fire extinguishing agent is inadequate, changes to nozzle orientations are made, and the process is repeated. As can be appreciated, such a process is complex, expensive, and time-consuming. The process can last multiple weeks and cost millions of dollars for each new installation.

As another option, the fire extinguishing distribution system can be upsized to overcome inefficient distribution. For example, such a system can disperse overwhelming amounts of extinguishing agent. However, such a system adds substantial cost and weight to an aircraft.

SUMMARY OF THE DISCLOSURE

A need exists for a system and a method for effectively and efficiently configuring fire extinguishers within a compartment, such as an engine compartment or auxiliary power unit of an aircraft. Further, a need exists for a less costly and time consuming method for determining locations, orientations, and the like of fire extinguishers within a compartment.

With those needs in mind, certain examples of the present disclosure provide a system for configuring one or more fire extinguishers within a compartment. The system includes a configuration control unit configured to determine one or more fluid flow paths within the compartment from a fluid dynamics model. The configuration control unit is further configured to determine a configuration for one or more nozzles (for example, potential configuration for one or more nozzles) of the one or more fire extinguishers based on the one or more fluid paths.

In at least one example, the system also includes the one or more fire extinguishers having the one or more nozzles. The one or more nozzles are physically configured according to the configuration determined by the configuration control unit.

In at least one example, the compartment is ventilated, and includes one or more fluid inlets and one or more fluid outlets. The one or more fluid flow paths extend between the fluid inlet(s) and the fluid outlet(s). As an example, the compartment is an engine or engine compartment of an aircraft.

In at least one example, the configuration control unit is configured to: identify one or more airflow bounding conditions, and determine streamlines from seed points on surfaces of a plume model. As a further example, the configuration control unit is further configured to compare predicted fire extinguishing agent pathways to particular areas of interest.

In at least one example, the configuration control unit is configured to assess various dispersal points for fire extinguishing agent from the one or more nozzles, and determine end point locations of the fire extinguishing agent within the compartment.

In at least one example, the configuration control unit is configured to determine end point locations for fire extinguishing agent within the compartment and analyze the one or more fluid flow paths in reverse to determine the configuration of the one or more nozzles of the one or more fire extinguishers.

In at least one example, the configuration control unit is further configured to automatically configure the one or more nozzles according to the configuration.

Certain examples of the present disclosure provide a method for configuring one or more fire extinguishers within a compartment. The method includes determining, by a configuration control unit, one or more fluid flow paths within the compartment from a fluid dynamics model; and determining, by the configuration control unit, a configuration for one or more nozzles of the one or more fire extinguishers based on the one or more fluid paths.

Certain examples of the present disclosure provide a non-transitory computer-readable storage medium comprising executable instructions that, in response to execution, cause one or more control units comprising a processor, to perform operations comprising: determining one or more fluid flow paths within the compartment from a fluid dynamics model; and determining a configuration for one or more nozzles of the one or more fire extinguishers based on the one or more fluid paths.

DETAILED DESCRIPTION OF THE DISCLOSURE

The foregoing summary, as well as the following detailed description of certain examples will be better understood when read in conjunction with the appended drawings. As used herein, an element or step recited in the singular and preceded by the word “a” or “an” should be understood as not necessarily excluding the plural of the elements or steps. Further, references to “one example” are not intended to be interpreted as excluding the existence of additional examples that also incorporate the recited features. Moreover, unless explicitly stated to the contrary, examples "comprising" or "having" an element or a plurality of elements having a particular condition can include additional elements not having that condition.

Examples of the present disclosure provide systems and methods that utilize analyses to determine aiming points for seeding (for example, ejecting or otherwise dispersing) fire extinguishing agent into a compartment for efficient distribution to all parts of the compartment. In at least one example, a configuration control unit uses preferred areas of concentration to run ventilation flow backwards and identify available seed points. In at least one example, the configuration control unit determines an end state of agent distribution to move backwards to a starting point, thereby providing preferred seed points for one or more nozzles of one or more fire extinguishers. Based on such determination, the nozzles are configured to direct fire extinguishing agent into the particular areas, achieving a passing configuration with fewer iterations.

Certain examples of the present disclosure provide a system for determining aiming points of nozzles of fire extinguishers in a compartment, such as an engine compartment (for example, the volume in which an engine is installed or otherwise disposed) or auxiliary power unit compartment (for example, the volume in which an auxiliary power unit is installed or otherwise disposed) of an aircraft. The system includes a configuration control unit that receives a three-dimensional model of geometry of the compartment, identifies airflow bounding conditions, generates a computational fluid dynamics model, evaluates the flow patterns using velocity profiles, and determines nozzle configurations based on pathway determinations.

In at least one example, the system and method evaluate one or more computational fluid dynamics models to determine a fluid flow, and determine reverse flow positions from the model(s) to determine nozzle configurations (such as locations and orientations) to optimize fire extinguishing agent distribution. In at least one example, the system and method use the one or more computational fluid dynamic models to evaluate flow patterns to determine a flow path as a starting point. The models provide an indication of cooling flows in the compartment.

Figure 1:
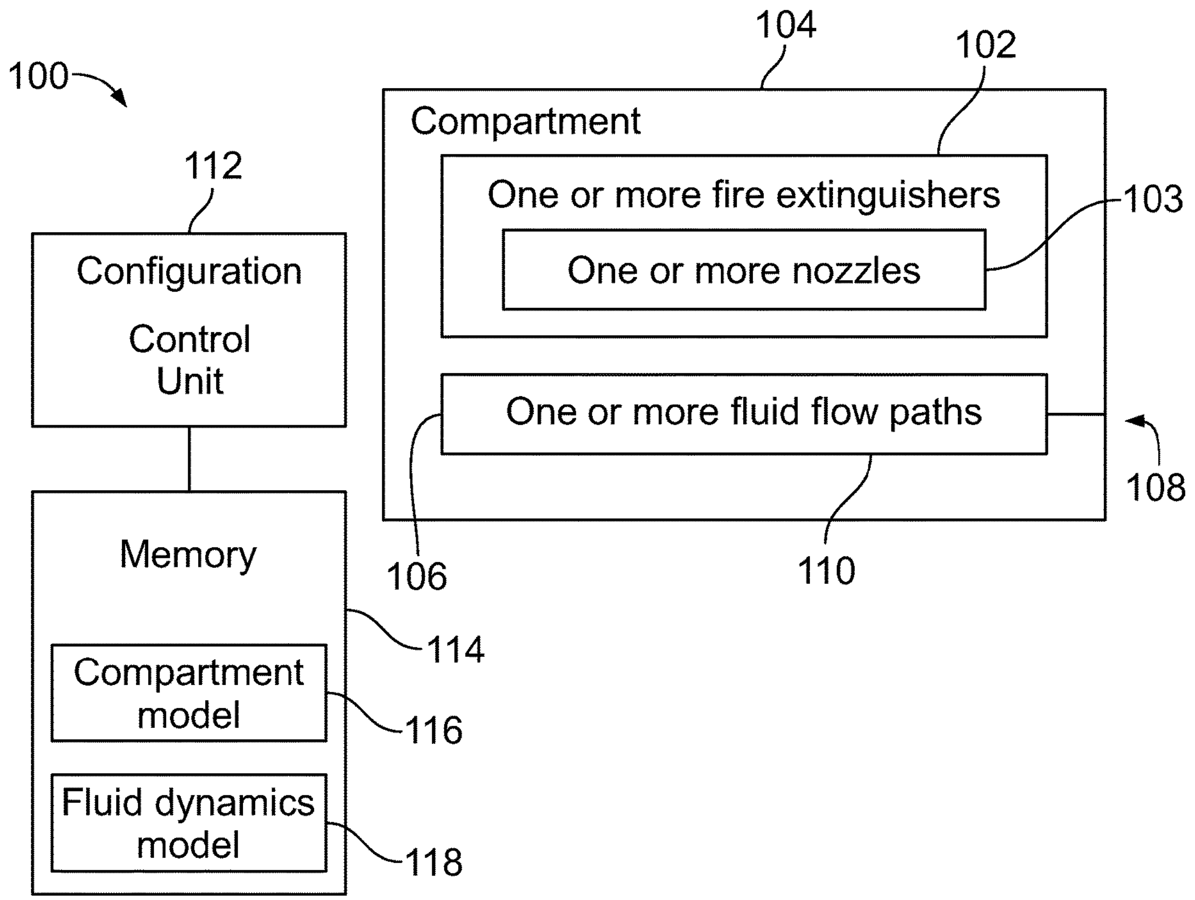
FIG. 1 illustrates a schematic block diagram of a system for configuring one or more fire extinguishers within a compartment, according to an example of the present disclosure.

FIG. 1 illustrates a schematic block diagram of a system 100 for configuring one or more fire extinguishers 102 within a compartment 104, according to an example of the present disclosure. The one or more fire extinguishers 102 include one or more nozzles 103 configured to disperse fire extinguishing agent therefrom. The compartment 104 includes an enclosed volume having one or more internal components. The fire extinguishers 102 are disposed on or within the compartment 104 and are configured to disperse fire extinguishing agent into the compartment 104 in response to a fire therein.

In at least one example, the compartment 104 is ventilated, and includes one or more fluid inlets 106 and one or more fluid outlets 108. One or more fluid flow paths 110 extend between the fluid inlet 106 and the fluid outlet 108. Fluid, such as air, flows through the compartment between the fluid inlet 106 and the fluid outlet 108 along the one or more fluid flow paths 110. As an example, the compartment 104 is an engine of an aircraft. As a further example, the compartment 104 is an engine fire zone of an aircraft. In an engine of an aircraft, air enters the fluid inlet 106 and flows along the one or more fluid flow paths 110 before being discharged out of the fluid outlet 108. As another example, the compartment 104 is an auxiliary power unit of an aircraft. As another example, the compartment 104 is an engine of an automobile. As another example, the compartment 104 is a data center or computer room, such as can include a plurality of servers. As another example, the compartment 104 is a clean room in which computer chips are manufactured. As another example, the compartment 104 can be an operating room within a medical facility.

The system 100 also includes a configuration control unit 112 in communication with a memory 114, such as through one or more wired or wireless connections. The configuration control unit 112 can be separate and distinct from the memory 114. In at least one other example, the configuration control unit 112 includes the memory 114.

The memory 114 stores data, which includes a compartment model 116 and a fluid dynamics model 118. The fluid dynamics model 118 is a virtual model of fluid flow within the compartment, based on fluid dynamics computational analysis. The compartment model 116 includes information regarding the internal and external structure and geometry of the compartment 104. The fluid dynamics model 118 is predetermined and includes information regarding the flow of fluid, such as air, through the compartment 104. As an example, the fluid dynamics model 118 includes information regarding the one or more fluid flow paths 110 within the compartment 104. The information regarding the one or more fluid flow paths 110 includes air flow patterns, including areas of laminar fluid flow, turbulent fluid flow, air swirling locations, areas of lower and higher rates of flow, and/or the like.

In operation, the configuration control unit 112 determines the configuration of the one or more fire extinguishers 102 based on the fluid dynamics model 118. For example, the fluid dynamics model 118 includes the one or more fluid flow paths 110 within the compartment 104, including the time for fluid to enter the fluid inlet 106 and pass out of the fluid outlet 108. In response to receiving the fluid dynamics model 118 of the flow of fluid through the compartment 104 along the one or more fluid flow paths 110, the configuration control unit 112 determines the configuration (such as the number, locations, and orientation) of the one or more nozzles 103 of the one or more fire extinguishers 102 to ensure that the fire extinguishing agent dispersed from the one or more nozzles 103 is dispersed on and over particular locations of the compartment 104. Based on the determination of the configuration of the one or more nozzles 103 by the configuration control unit 112, the one or more fire extinguishers 102 are positioned on and/or within the compartment 104. In particular, the one or more nozzles 103 are configured (for example, a number of the nozzles, locations for the nozzles 103, aiming directions of the nozzles 103, and the like) as determined by the configuration control unit 112.

As an example, the compartment model 116 and the fluid dynamics model 118 are predetermined. Based on the fluid dynamics model 118 of the one or more fluid flow paths 108 within the compartment 104 (the structure and geometry of which can be analyzed through the compartment model 116), the configuration control unit 112 identifies one or more airflow bounding conditions. The airflow bounding conditions are or otherwise include ventilation (such as flow of air between the fluid inlet 106 and the fluid outlet 108) conditions that flow through the compartment 104. Such airflow bounding conditions can include speed of an aircraft (and subsequent flow of air through the compartment), altitude of the aircraft, open and flow states of one or more valves within the compartment, and/or the like. Based on the one or more fluid flow paths 108 as included within the fluid dynamics model 118, the configuration control unit 112 then determines streamlines from seed points on surfaces of a plume model, which can also be stored in the memory 114. In at least one example, the fluid dynamics model 118 includes the plume model. Optionally, the plume model can be separate and distinct from the fluid dynamic model 118. The plume model relates to the one or more nozzles 103. For example, the plume model includes a volume and cone of fire extinguishing agent that is dispersed from the one or more nozzles 103. The streamlines are the flow of the fire extinguishing agent from the dispersal points of the one or more nozzles 103 along the one or more fluid flow paths 110. After determining the streamlines form the seed points on surfaces of the plume model, the configuration control unit 112 then compares predicted fire extinguishing agent pathways (as flow along the one or more fluid flow paths 110) to particular areas of interest. The areas of interest are locations where fire extinguishing agent is desired to be deposited or otherwise dispersed. If the configuration control unit 112 determines that the areas of interest are adequately covered by the fire extinguishing agent based on the fluid dynamics model (including the fluid flow paths 110) and the plume model, the configuration control unit 112 determines that the configuration of the one or more nozzles 103 are sufficient. If, however, the configuration control unit 112 determines that the areas of interest are not adequately covered by the fire extinguishing agent based on the fluid dynamic model and the plume model, the configuration control unit 112 discards the configuration for the one or more nozzles 103, and assess a different configuration. The process then repeats. As such, in at least one example, the configuration control unit 112 assesses various dispersal points for fire extinguishing agent from the one or more nozzles 103 and determines end point locations of the fire extinguishing agent within the compartment 104.

In at least one other example, the configuration control unit 112 determines the end point locations for the extinguishing agent with the compartment 104 and analyzes the fluid dynamic model 118 (for example, the one or more virtual fluid flow paths in reverse) and/or the plume model to determine the configuration of the one or more nozzles 103 of the one or more fire extinguishers. For example, the configuration control unit 112 determines the locations for the fire extinguishing agent to be deposited within the compartment 104 (that is, the areas of interest). Such locations can be predetermined and programmed into the memory 114, such as within the compartment model 116. The configuration control unit 112 then analyzes the fluid dynamics model 116 and follows the one or more fluid paths 110 backward to points within the compartment 104. The configuration control unit 112 then determines the points as the locations for the one or more nozzles 103, and can then determine the configuration of the one or more nozzles 103 based on the fluid dynamics model 118 and the plume model.

As described herein, the configuration control unit 112 determines a configuration for the one or more nozzles 103 of the one or more fire extinguishers 102 based on the fluid dynamics model 118. The configuration control unit 112 outputs configuration data regarding the configuration for the one or more nozzles 103, which is then used to physically configure the one or more nozzles 103 of the one or more fire extinguishers on and/or within the compartment 104. In at least one further example, the configuration data can be used to automatically configure the one or more nozzles 103. Optionally, the configuration control unit 112 may automatically configure the one or more nozzles 103 based on a determined configuration, such as set forth in the configuration data. For example, the one or more fire extinguishers 102 and/or the one or more nozzles 103 can be operatively coupled to one or more actuators that automatically move the one or more fire extinguishers 102 and/or the one or more nozzles 103 according to the configuration data received from the configuration control unit 112. The configuration control unit 112 can operate the one or more actuators to automatically move the one or more nozzles 103 into the determined configuration.

As described herein, the system 100 for configuring the one or more fire extinguishers 102 within the compartment 104 includes the configuration control unit 112 configured to determine (for example, virtually determine) the one or more fluid flow paths 110 within the compartment 104 from the fluid dynamics model 118. The configuration control unit 112 is further configured to determine a configuration for the one or more nozzles 103 of the one or more fire extinguishers 102 based on the one or more fluid paths 110. In at least one example, the system 100 also includes the one or more fire extinguishers 102 having the one or more nozzles 103, which are physically configured according to the configuration determined by the configuration control unit 112.

As used herein, the term "control unit," "central processing unit," "unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the configuration control unit 112 may be or include one or more processors that are configured to control operation thereof, as described herein.

The configuration control unit 112 is configured to execute a set of instructions that are stored in one or more data storage units or elements (such as one or more memories), in order to process data. For example, the configuration control unit 112 may include or be coupled to one or more memories, such as the memory 114. The data storage units may also store data or other information as desired or needed. The data storage units may be in the form of an information source or a physical memory element within a processing machine.

The set of instructions may include various commands that instruct the configuration control unit 112 as a processing machine to perform specific operations such as the methods and processes of the various embodiments of the subject matter described herein. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of embodiments herein may illustrate one or more control or processing units, such as the configuration control unit 112. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the configuration control unit 112 may represent processing circuitry such as one or more of a field programmable gate array (FPGA), application specific integrated circuit (ASIC), microprocessor(s), and/or the like. The circuits in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

Figure 2:
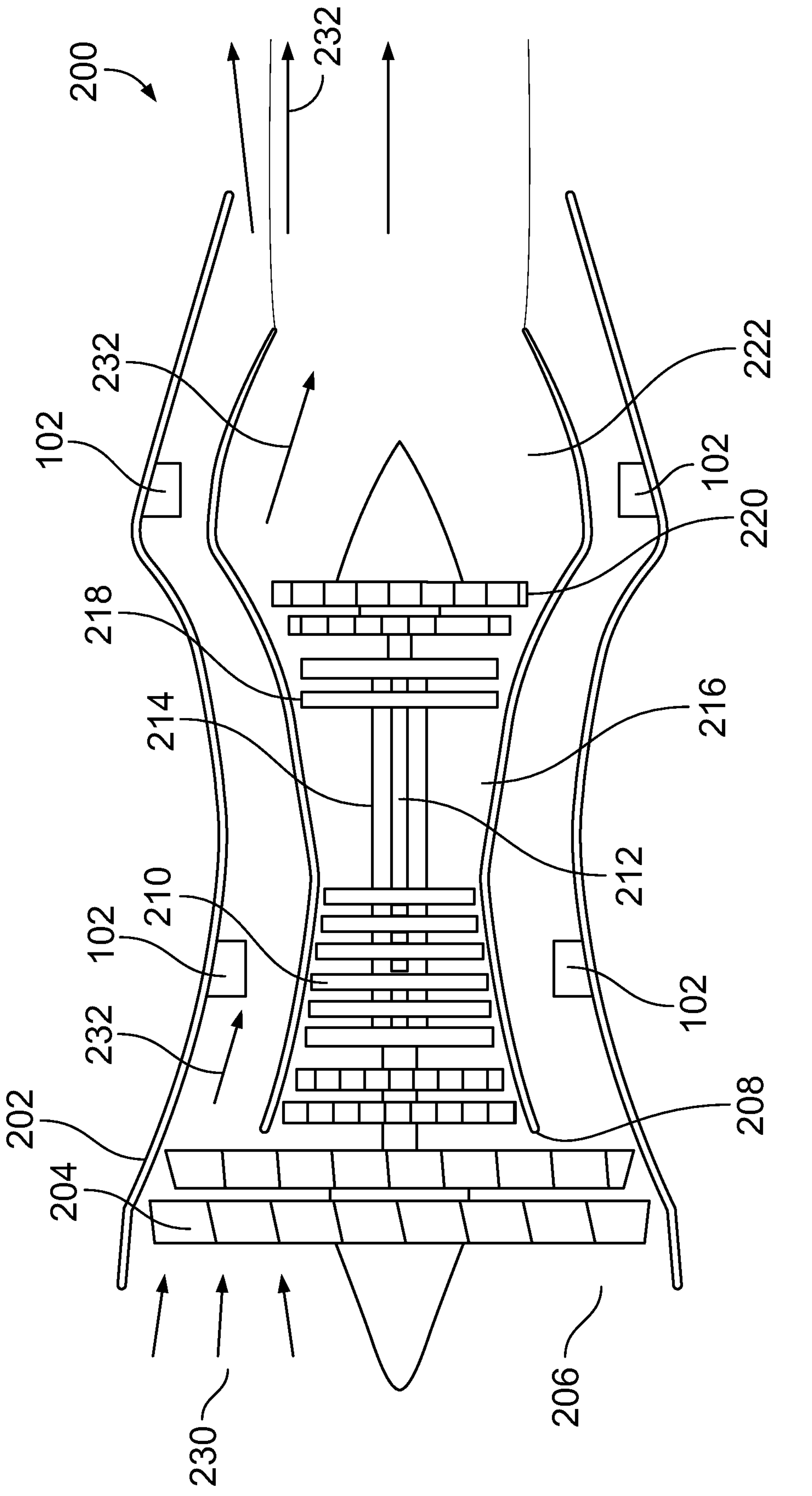
FIG. 2 illustrates an internal cross-sectional view of an engine of an aircraft, according to an example of the present disclosure.

FIG. 2 illustrates an internal cross-sectional view of an engine 200 of an aircraft, according to an example of the present disclosure. The engine 200 is an example of the compartment 104, as shown in FIG. 1. The engine 200 includes a housing 202, which can include a nacelle, cowling, and the like. The engine 200 includes a fan 204 within the housing 202 proximate to an air inlet 206 (which is an example of the fluid inlet 106, shown in FIG. 1). A low pressure compressor 208 is downstream from the fan 204. A high pressure compressor 210 is downstream from the low pressure compressor 208. The engine 200 also includes a combustion chamber 216, a high pressure turbine 218 coupled to a high pressure shaft 214, and a low pressure turbine 220 coupled to a low pressure shaft 212. A nozzle 222 is located opposite from the air inlet 206. The nozzle 222 is an example of the fluid outlet 108, shown in FIG. 1. Air 230 flows into, through, and out of the engine 200 along one or more air flow paths 232, which are examples of the one or more fluid flow paths 110, shown in FIG. 1. The air 230 traveling along the air flow path(s) 232 ventilates the compartment around the core of the engine, for example. One or more fire extinguishers 102 are disposed on or within the engine 200, such as mounted to portions of the housing 202.

Figure 3:
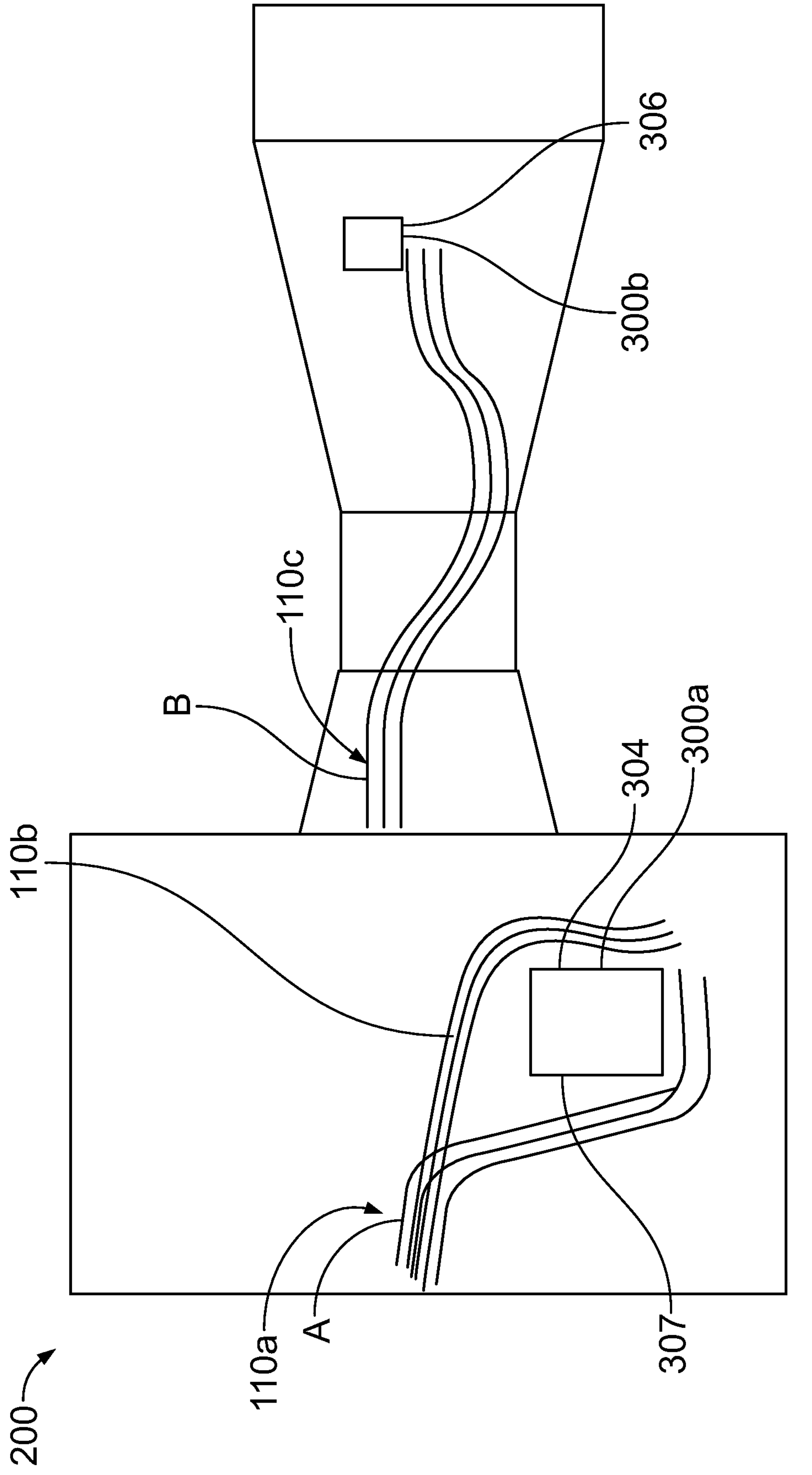
FIG. 3 illustrates a simplified internal lateral view of the engine, according to an example of the present disclosure.

FIG. 3 illustrates a simplified internal lateral view of the engine 200, according to an example of the present disclosure. The engine 200 includes one or more areas of interest, such as the area of interest 300*a* and the area of interest 300*b*. The areas of interest 300*a* and 300*b* can be shadowed areas that are behind large coolers or other components within the engine 200. The areas of interest 300*a* and 300*b* can be locations that would be otherwise challenging to reach with fire extinguishing agent from a fire extinguishing system located primarily in an upper portion of the engine 200.

Referring to FIGS. 1-3, in at least one example, the configuration control unit 112 analyzes a computational fluid dynamic model, such as the fluid dynamics model 118 to determine the fluid flow paths 110*a*, 110*b*, and 110*c* within the engine 300. The fluid dynamic model 118 is predetermined and stored in the memory 114, for example. The fluid flow paths 110*a*, 110*b*, and 110*c* can be undercowl flow fields within the engine 300. The fluid dynamics model 118 can include more or fewer fluid flow paths than shown. The configuration control unit 112 determines where fire extinguishing agent will go when dispersed from a particular location within the engine 200, by following streamlines of the fluid dynamic model 118. For example, based on the fluid dynamic model 118 (and optionally the plume model) fire extinguishing agent dispersed from point A into the streamline of the fluid flow path 110*a* will cover a fore end 302 and an aft end 304 of the area of interest 300*a*, which can be or otherwise include a heat exchanger. As another example, based on the fluid dynamic model 118 (and optionally the plume model) fire extinguishing agent dispersed from point B into the streamline of the fluid flow path 110*c* will cover a lower surface 306 of the area of interest 300*b*, such as another heat exchanger.

In at least one example, the configuration control unit 112 operates according to a starting point process. For example, the configuration control unit 112 analyzes the streamlines and velocity profiles (of airflow within the engine) to select locations to seed with fire extinguishing agent to generate a preferred fire extinguishing agent distribution pattern within the engine 200.

In at least one other example, the configuration control unit 112 operates according to a finishing point process. For example, the configuration control unit 112 analyzes the streamlines and velocity profiles to determine the one or more fluid flow paths 110 before reaching the areas of interest. That is, the configuration control unit 112 determines the areas of interest to be covered with fire extinguishing agent, and works backwards in relation to the one or more fluid flow paths 110 to determine the configuration for the one or more nozzles 103 of the one or more fire extinguishers 102.

In at least one example, the configuration control unit 112 operates according to both the starting point process and the finishing point process. Such an example can provide increased confidence and accuracy in relation to a determined configuration.

Figure 4:
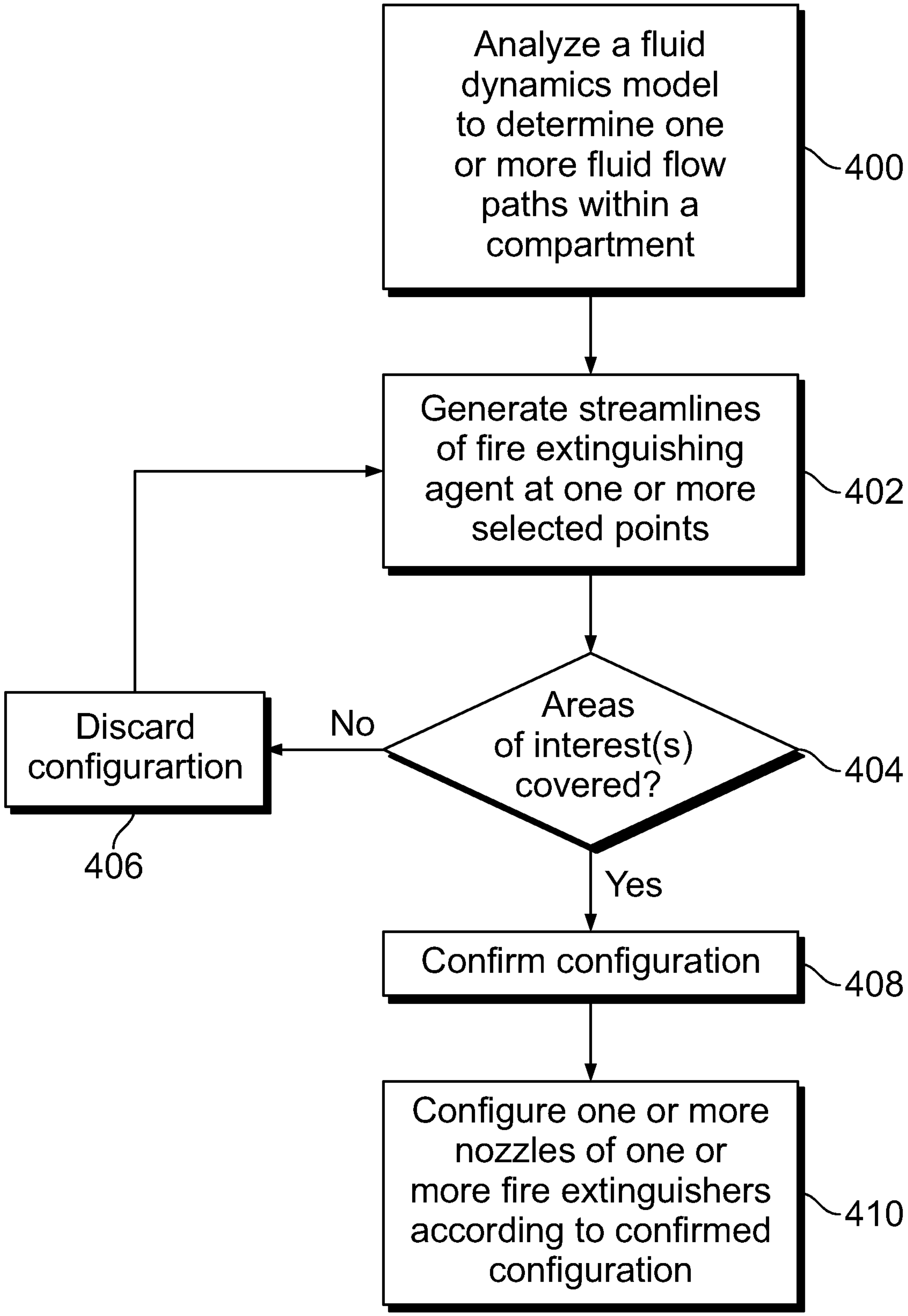
FIG. 4 illustrates a flow chart of a method for configuring one or more fire extinguishers within a compartment, according to an example of the present disclosure.

FIG. 4 illustrates a flow chart of a method for configuring one or more fire extinguishers within a compartment, according to an example of the present disclosure. Referring to FIGS. 1 and 4, at 400, the configuration control unit 112 analyzes the fluid dynamics model 118 to determine the one or more fluid flow paths 110 within the compartment 104. At 402, the configuration control unit 112 generates streamlines of fire extinguishing agent at one or more selected points along the one or more fluid flow paths 110. At 404, the configuration control unit determines if the areas of interest will be covered by the fire extinguishing agent, based on the flow of fluid extinguishing agent along the streamlines. If the areas of interest are not covered based on such analysis, the method proceeds to 406, at which such configuration is discarded, and the method returns to 402.

If, however, the configuration control unit 112 determines that the areas of interest 404 will be covered by the fire extinguishing agent, the method proceeds from 404 to 408, at which the configuration control unit 112 confirms the configuration. Then, at 410, the one or more nozzles 103 of the one or more fire extinguishers 102 are physically configured according to the confirmed configuration (which the configuration control unit 112 virtually determined based, at least in part, on the fluid dynamics model). For example, the configuration control unit 112 provides a configuration for the fire extinguishers 102, which can then be constructed and installed by one or more individuals.

Figure 5:
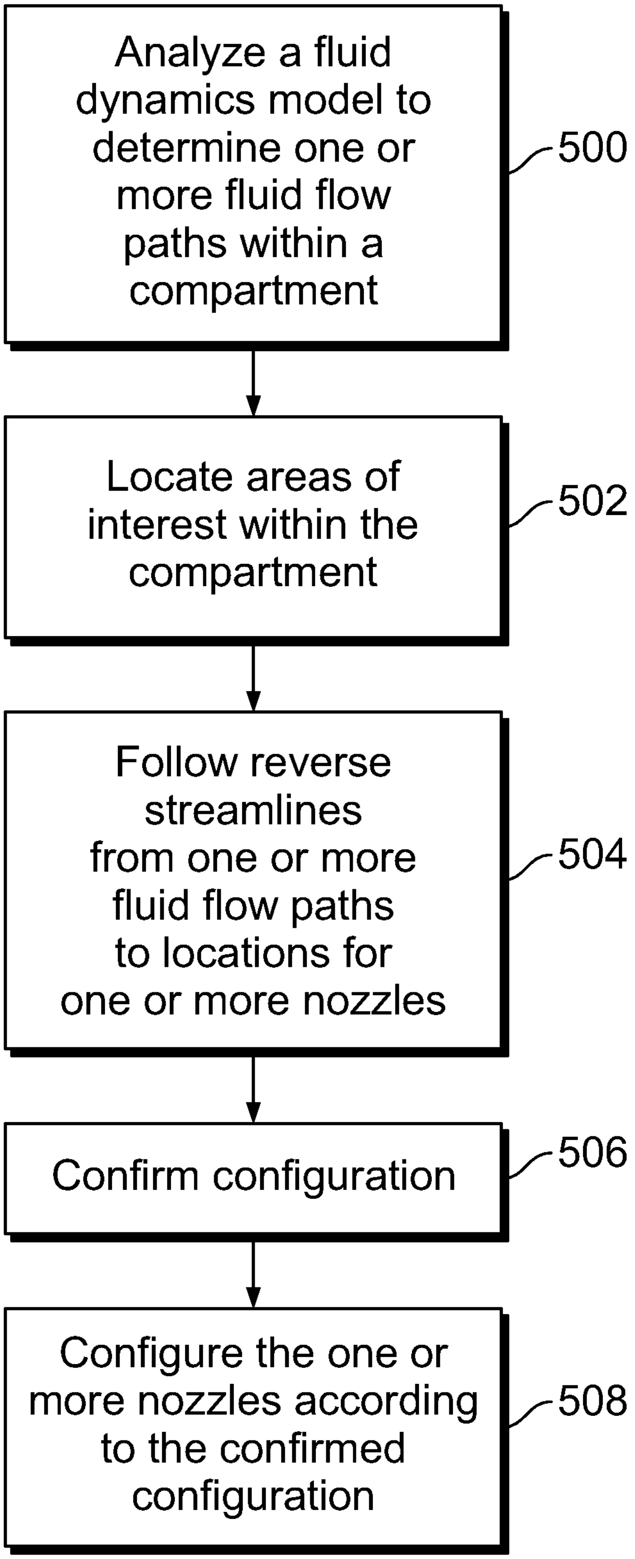
FIG. 5 illustrates a flow chart of a method for configuring one or more fire extinguishers within a compartment, according to an example of the present disclosure.

FIG. 5 illustrates a flow chart of a method for configuring one or more fire extinguishers within a compartment, according to an example of the present disclosure. Referring to FIGS. 1 and 5, at 500, the configuration control unit 112 analyzes the fluid dynamics model 118 to determine the one or more fluid flow paths 110 within the compartment 104. At 502, the configuration control unit 112 locates the areas of interest (to be covered with the fire extinguishing agent) within the compartment 104. At 504, the configuration control unit 112 flows reverse streamlines of the one or more fluid flow paths 110 from the areas of interest to locations for the one or more nozzles 103 on and/or within the compartment 104. At 506, the configuration control unit 112 then confirms the configuration. Then, at 508, the one or more nozzles 103 of the one or more fire extinguishers 102 are physically configured according to the confirmed configuration (which the configuration control unit 112 virtually determined based, at least in part, on the fluid dynamics model).

Figure 6:
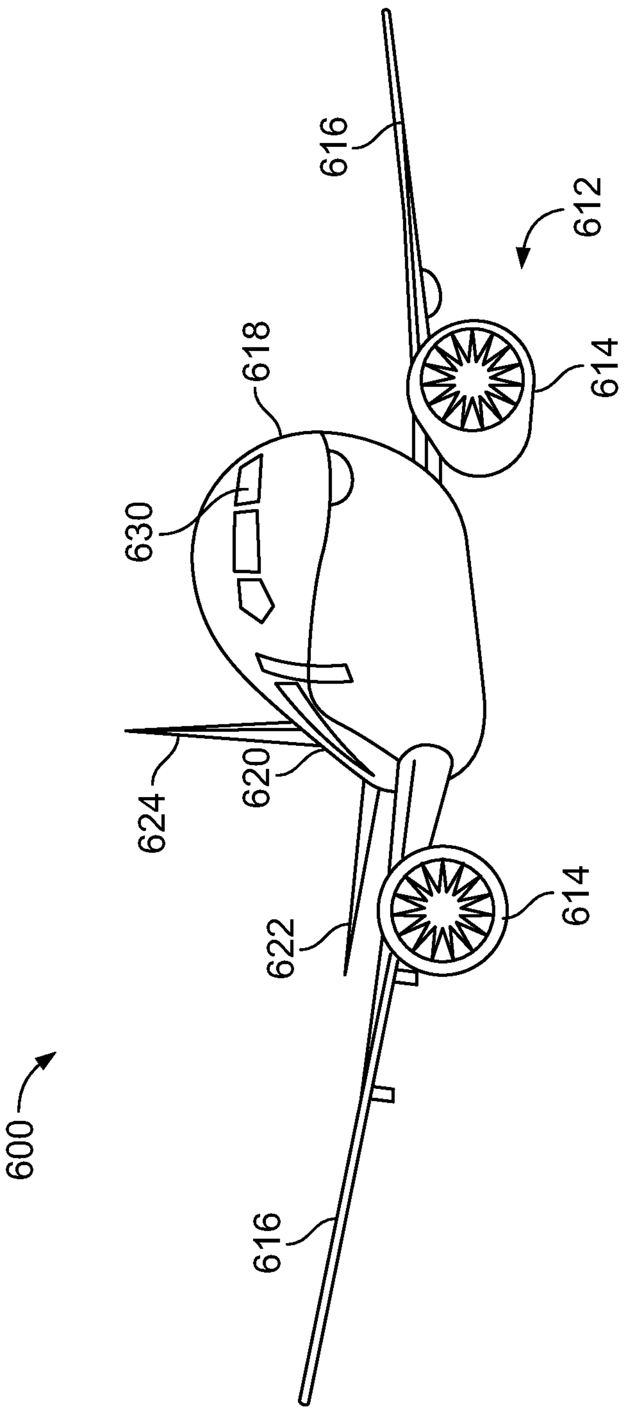
FIG. 6 illustrates a front perspective view of an aircraft, according to an example of the present disclosure.

FIG. 6 illustrates a front perspective view of an aircraft 600, according to an exemplary embodiment of the present disclosure. The aircraft 600 includes a propulsion system 612 that can include two turbofan engines 614. Optionally, the propulsion system 612 can include turbojet engines, turboprop engines, or turboshafts (such as commonly used with helicopters). The turbofan engines 614 are examples of the engine 200 shown in FIGS. 2 and 3. Optionally, the propulsion system 612 can include more engines 614 than shown. The engines 614 are carried by wings 616 of the aircraft 600. In other examples, the engines 614 can be carried by a fuselage 618 and/or an empennage 620. The empennage 620 can also support horizontal stabilizers 622 and a vertical stabilizer 624. The fuselage 618 of the aircraft 600 defines an internal cabin, which may include a flight deck or cockpit 630. Examples of the present disclosure can be used with various components of the aircraft, such as the engines 614.

The aircraft 600 may be sized, shaped, and configured other than shown in FIG. 6. For example, the aircraft 600 may be a non-fixed wing aircraft, such as a helicopter. As another example, the aircraft 600 can be an unmanned aerial vehicle (UAV). Optionally, examples of the present disclosure can be used with various other types of vehicles, such as automobiles, trains, watercraft, or the like. Also, optionally, examples of the present disclosure can be used with various ventilated compartments of fixed structures, such as within residential or commercial buildings.

Further, the disclosure comprises examples according to the following clauses:

Clause 1. A system for configuring one or more fire extinguishers within a compartment, the system comprising:

a configuration control unit configured to determine one or more fluid flow paths within the compartment from a fluid dynamics model, wherein the configuration control unit is further configured to determine a configuration for one or more nozzles of the one or more fire extinguishers based on the one or more fluid paths.

Clause 2. The system of Clause 1, further comprising the one or more fire extinguishers having the one or more nozzles, wherein the one or more nozzles are physically configured according to the configuration determined by the configuration control unit.

Clause 3. The system of Clauses 1 or 2, wherein the compartment is ventilated, and includes one or more fluid inlets and one or more fluid outlets, and wherein the one or more fluid flow paths extend between the one or more fluid inlets and the one or more fluid outlets.

Clause 4. The system of any of Clauses 1-3, wherein the compartment is an engine of an aircraft.

Clause 5. The system of any of Clauses 1-4, wherein the configuration control unit is configured to:

identify one or more airflow bounding conditions, and determine streamlines from seed points on surfaces of a plume model.

Clause 6. The system of Clause 5, wherein the configuration control unit is further configured to compare predicted fire extinguishing agent pathways to particular areas of interest.

Clause 7. The system of any of Clauses 1-6, wherein the configuration control unit is configured to assess various dispersal points for fire extinguishing agent from the one or more nozzles, and determine end point locations of the fire extinguishing agent within the compartment.

Clause 8. The system of any of Clauses 1-7, wherein the configuration control unit is configured to determine end point locations for fire extinguishing agent within the compartment and analyze the one or more fluid flow paths in reverse to determine the configuration of the one or more nozzles of the one or more fire extinguishers.

Clause 9. The system of any of Clauses 1-8, wherein the configuration control unit is further configured to automatically configure the one or more nozzles according to the configuration.

Clause 10. A method for configuring one or more fire extinguishers within a compartment, the method comprising:

determining, by a configuration control unit, one or more fluid flow paths within the compartment from a fluid dynamics model; and determining, by the configuration control unit, a configuration for one or more nozzles of the one or more fire extinguishers based on the one or more fluid paths.

Clause 11. The method of Clause 10, further physically configuring the one or more nozzles according to the configuration determined by the configuration control unit.

Clause 12. The method of Clauses 10 or 11, wherein the compartment is ventilated, and includes one or more fluid inlets and one or more fluid outlets, and wherein the one or more fluid flow paths extend between the one or more fluid inlets and the one or more fluid outlets.

Clause 13. The method of any of Clauses 10-12, wherein the compartment is an engine of an aircraft.

Clause 14. The method of any of Clauses 10-13, wherein said determining the configuration comprises:

identifying one or more airflow bounding conditions; and determining streamlines from seed points on surfaces of a plume model.

Clause 15. The method of Clause 14, wherein said determining the configuration further comprises comparing predicted fire extinguishing agent pathways to particular areas of interest.

Clause 16. The method of any of Clauses 10-15, wherein said determining the configuration comprises:

assessing various dispersal points for fire extinguishing agent from the one or more nozzles; and determining end point locations of the fire extinguishing agent within the compartment.

Clause 17. The method of an of Clauses 10-16, wherein said determining the configuration comprises:

determining end point locations for fire extinguishing agent within the compartment; and analyzing the one or more fluid flow paths in reverse to determine the configuration of the one or more nozzles of the one or more fire extinguishers.

Clause 18. The method of any of Clauses 10-17, further comprising automatically configuring, by the configuration control unit, the one or more nozzles according to the configuration.

Clause 19. A non-transitory computer-readable storage medium comprising executable instructions that, in response to execution, cause one or more control units comprising a processor, to perform operations comprising:

determining one or more fluid flow paths within the compartment from a fluid dynamics model; and determining a configuration for one or more nozzles of the one or more fire extinguishers based on the one or more fluid paths.

Clause 20. The non-transitory computer-readable storage medium of Clause 19, wherein the compartment is an engine of an aircraft.

As described herein, examples of the present disclosure provide systems and methods for effectively and efficiently configuring fire extinguishers within a compartment, such as an engine (for example, an engine compartment, fire zone, or the like) or auxiliary power unit of an aircraft. Further, examples of the present disclosure provide cost effective and time saving methods for determining locations, orientations, and the like of fire extinguishers within a compartment.

While various spatial and directional terms, such as top, bottom, lower, mid, lateral, horizontal, vertical, front and the like can be used to describe examples of the present disclosure, it is understood that such terms are merely used with respect to the orientations shown in the drawings. The orientations can be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described examples (and/or aspects thereof) can be used in combination with each other. In addition, many modifications can be made to adapt a particular situation or material to the teachings of the various examples of the disclosure without departing from their scope. While the dimensions and types of materials described herein are intended to define the parameters of the various examples of the disclosure, the examples are by no means limiting and are exemplary examples. Many other examples will be apparent to those of skill in the art upon reviewing the above description. The scope of the various examples of the disclosure should, therefore, be determined with reference to the appended claims, along with the full scope of equivalents to which such claims are entitled. In the appended claims and the detailed description herein, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various examples of the disclosure, including the best mode, and also to enable any person skilled in the art to practice the various examples of the disclosure, including making and using any devices or systems and performing any incorporated methods. The patentable scope of the various examples of the disclosure is defined by the claims, and can include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A system comprising:

a compartment of an aircraft;

one or more fire extinguishers having one or more nozzles; and a configuration control unit including one or more processors configured to:

identify airflow bounding conditions including a speed of the aircraft and an altitude of the aircraft, determine one or more fluid flow paths within the compartment from a fluid dynamics model, and determine a configuration for the one or more nozzles of the one or more fire extinguishers based on the one or more fluid paths, wherein the one or more nozzles are physically configured within the compartment according to the configuration determined by the configuration control unit.

2. The system of claim 1, wherein the compartment is ventilated, and includes one or more fluid inlets and one or more fluid outlets, and wherein the one or more fluid flow paths extend between the one or more fluid inlets and the one or more fluid outlets.

3. The system of claim 1, wherein the compartment is an engine of the aircraft.

4. The system of claim 1, wherein the configuration control unit is further configured to determine streamlines from seed points on surfaces of a plume model.

5. The system of claim 4, wherein the configuration control unit is further configured to compare predicted fire extinguishing agent pathways to particular areas of interest.

6. The system of claim 1, wherein the configuration control unit is further configured to assess various dispersal points for fire extinguishing agent from the one or more nozzles, and determine end point locations of the fire extinguishing agent within the compartment.

7. The system of claim 1, wherein the configuration control unit is further configured to determine end point locations for fire extinguishing agent within the compartment and analyze the one or more fluid flow paths in reverse to determine the configuration of the one or more nozzles of the one or more fire extinguishers.

8. The system of claim 1, wherein the configuration control unit is further configured to automatically configure the one or more nozzles according to the configuration.

9. A method for configuring one or more fire extinguishers within a compartment of an aircraft, the method comprising:

determining, by a configuration control unit, one or more fluid flow paths within the compartment from a fluid dynamics model, wherein said determining comprises identifying, by the configuration control unit, airflow bounding conditions including a speed of the aircraft and an altitude of the aircraft; and determining, by the configuration control unit, a configuration for one or more nozzles of the one or more fire extinguishers based on the one or more fluid paths; and physically configuring the one or more nozzles according to the configuration determined by the configuration control unit.

10. The method of claim 9, wherein the compartment is ventilated, and includes one or more fluid inlets and one or more fluid outlets, and wherein the one or more fluid flow paths extend between the one or more fluid inlets and the one or more fluid outlets.

11. The method of claim 9, wherein the compartment is an engine of the aircraft.

12. The method of claim 9, wherein said determining the configuration comprises:

determining streamlines from seed points on surfaces of a plume model.

13. The method of claim 12, wherein said determining the configuration further comprises comparing predicted fire extinguishing agent pathways to particular areas of interest.

14. The method of claim 9, wherein said determining the configuration comprises:

assessing various dispersal points for fire extinguishing agent from the one or more nozzles; and determining end point locations of the fire extinguishing agent within the compartment.

15. The method of claim 9, wherein said determining the configuration comprises:

determining end point locations for fire extinguishing agent within the compartment; and analyzing the one or more fluid flow paths in reverse to determine the configuration of the one or more nozzles of the one or more fire extinguishers.

16. The method of claim 9, further comprising automatically configuring, by the configuration control unit, the one or more nozzles according to the configuration.

17. The system of claim 1, wherein the airflow bounding conditions further comprise open and flow states of one or more valves within the compartment.

18. The system of claim 1, wherein the configuration control unit is further configured to:

operate according to a starting point process by analyzing streamlines and velocity profiles of airflow within the compartment to select locations to seed with fire extinguishing agent to generate a fire extinguishing agent distribution pattern within the compartment, and operate according to a finishing point process by analyzing the streamlines the velocity profiles of the airflow within the compartment to determine the one or more fluid flow paths before reaching areas of interest.

19. The method of claim 9, further comprising:

operating, by the configuration control unit, according to a starting point process by analyzing streamlines and velocity profiles of airflow within the compartment to select locations to seed with fire extinguishing agent to generate a fire extinguishing agent distribution pattern within the compartment, and operating, by the configuration control unit, according to a finishing point process by analyzing the streamlines the velocity profiles of the airflow within the compartment to determine the one or more fluid flow paths before reaching areas of interest.

20. A system comprising:

an aircraft including a compartment, wherein the compartment is ventilated, and includes one or more fluid inlets and one or more fluid outlets, and wherein one or more fluid flow paths extend between the one or more fluid inlets and the one or more fluid outlets;

one or more fire extinguishers having one or more nozzles; and a configuration control unit including one or more processors configured to:

identify airflow bounding conditions including a speed of the aircraft and an altitude of the aircraft, determine streamlines from seed points on surfaces of a plume model, determine the one or more fluid flow paths within the compartment from a fluid dynamics model, compare predicted fire extinguishing agent pathways to particular areas of interest, assess various dispersal points for fire extinguishing agent from the one or more nozzles, determine end point locations of the fire extinguishing agent within the compartment, determine a configuration for the one or more nozzles of the one or more fire extinguishers based on the one or more fluid paths by analyzing the one or more fluid flow paths in reverse to determine the configuration of the one or more nozzles of the one or more fire extinguishers, and automatically configure the one or more nozzles according to the configuration, wherein the one or more nozzles are physically configured within the compartment according to the configuration determined by the configuration control unit.

* * * * *